(12) United States Patent
Huang et al.

(10) Patent No.: US 11,207,838 B2
(45) Date of Patent: Dec. 28, 2021

(54) 3D INDICATOR OBJECT

(71) Applicant: HEWLETT-PACKARD DEVELOPMENT COMPANY, L.P., Houston, TX (US)

(72) Inventors: Wei Huang, Palo Alto, CA (US); Ingeborg Tastl, Palo Alto, CA (US); Melanie M. Gottwals, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 296 days.

(21) Appl. No.: 16/089,087

(22) PCT Filed: Oct. 27, 2016

(86) PCT No.: PCT/US2016/059167
§ 371 (c)(1),
(2) Date: Sep. 27, 2018

(87) PCT Pub. No.: WO2018/080506
PCT Pub. Date: May 3, 2018

(65) Prior Publication Data
US 2020/0298494 A1   Sep. 24, 2020

(51) Int. Cl.
*B29C 64/393* (2017.01)
*G06F 30/10* (2020.01)
(Continued)

(52) U.S. Cl.
CPC ........ *B29C 64/393* (2017.08); *G05B 19/4188* (2013.01); *G06F 30/10* (2020.01);
(Continued)

(58) Field of Classification Search
CPC ... B29C 64/393; G06F 30/10; G05B 19/4188; G05B 19/4099; G05B 2219/31304;
(Continued)

(56) References Cited

U.S. PATENT DOCUMENTS 7,229,144 B2 * 6/2007 Nielsen ................. B33Y 50/02
347/2
8,636,494 B2   1/2014 Gothait et al.
(Continued)

FOREIGN PATENT DOCUMENTS

EP        2852491       1/2019
WO    2008077850 A2    7/2008
(Continued)

OTHER PUBLICATIONS

MakeAlot "two colour calibration cubes" (Sep. 30, 2011) MakerBot Thingiverse, Retrieved from the Internet: URL: http://www.thingiverse.com/thing: 12069 [retrieved Oct. 14, 2015].
(Continued)

*Primary Examiner* — Thomas C Lee
*Assistant Examiner* — Ameir Myers
(74) *Attorney, Agent, or Firm* — Mannava & Kang

(57) ABSTRACT

According to an example, an apparatus may include a processor and a memory on which is stored instructions that are to cause the processor to identify features for a three-dimensional (3D) indicator object to be fabricated by a 3D fabricating device, in which the identified features define a shape and a pattern of colors for the 3D indicator object. The instructions may also cause the processor to instruct the 3D fabricating device to fabricate the 3D indicator object to have the identified features, in which the 3D indicator object has a shape having a plurality of surfaces on which a plurality of colors are arranged in a certain pattern as defined by the identified features, and in which each of the plurality of surfaces has the same certain pattern of the plurality of colors and determine properties of the fabricated 3D indicator object.

15 Claims, 4 Drawing Sheets

(51) Int. Cl.
*G05B 19/418* (2006.01)
*B33Y 10/00* (2015.01)
*B33Y 50/02* (2015.01)
*B33Y 80/00* (2015.01)

(52) U.S. Cl.
CPC ....... *B29K 2995/0021* (2013.01); *B33Y 10/00* (2014.12); *B33Y 50/02* (2014.12); *B33Y 80/00* (2014.12)

(58) Field of Classification Search
CPC .......... G05B 2219/49007; B33Y 10/00; B33Y 50/02; B33Y 80/00; B29K 2995/0021; B29K 2995/002
See application file for complete search history.

(56) References Cited

U.S. PATENT DOCUMENTS

| | | | |
|---|---|---|---|
| 10,442,135 B2* | 10/2019 | Morovic | G06F 30/00 |
| 10,926,528 B2* | 2/2021 | Tastl | B29C 64/393 |
| 2010/0007692 A1 | 1/2010 | Vanmaele et al. | |
| 2014/0046469 A1 | 2/2014 | Bickel et al. | |
| 2014/0048488 A1 | 2/2014 | Mason | |
| 2015/0061170 A1 | 3/2015 | Engel et al. | |
| 2015/0080495 A1 | 3/2015 | Heikkila | |
| 2016/0054231 A1 | 2/2016 | Hess et al. | |
| 2017/0225392 A1* | 8/2017 | Beak | B33Y 10/00 |
| 2019/0196449 A1* | 6/2019 | Zhang | G06T 19/20 |

FOREIGN PATENT DOCUMENTS

| | | |
|---|---|---|
| WO | 2015009397 A1 | 1/2015 |
| WO | 2015167520 A1 | 11/2015 |
| WO | 2016119884 A1 | 8/2016 |
| WO | WO-2016119902 | 8/2016 |
| WO | WO-2017019100 | 2/2017 |

OTHER PUBLICATIONS

Kitsakis et al., "An Investigation of Dimensional Accuracy of Multi-Jet Modeling Parts", Mathematical Models and Computational Methods, Retrieved from Internet—http://www.inase.org/library/2015/crete/bypaper/AME/AME-23.pdf, 2015, pp. 151-157.
Pedersen et al., "Additive Manufacturing Multi Material Processing and Part Quality Control", Retrieved from Internet—http://orbit.dtu.dk/ws/files/77749134/V2_lille_phd_afhandling_David_Bue_Pedersen..PDF, Nov. 2012, 237 Pages.

* cited by examiner

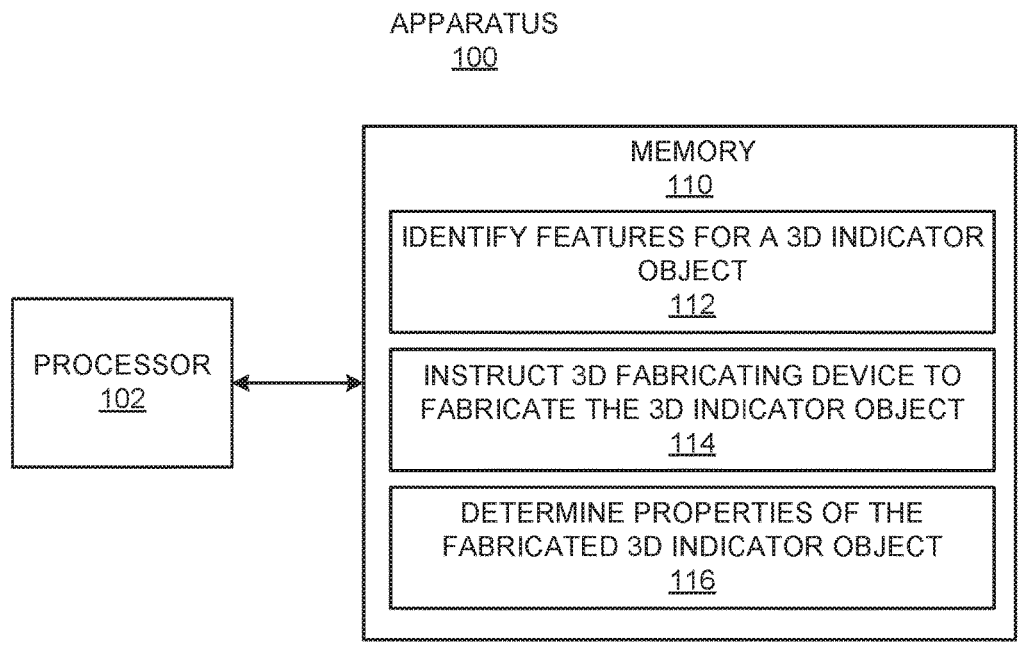
FIG. 1
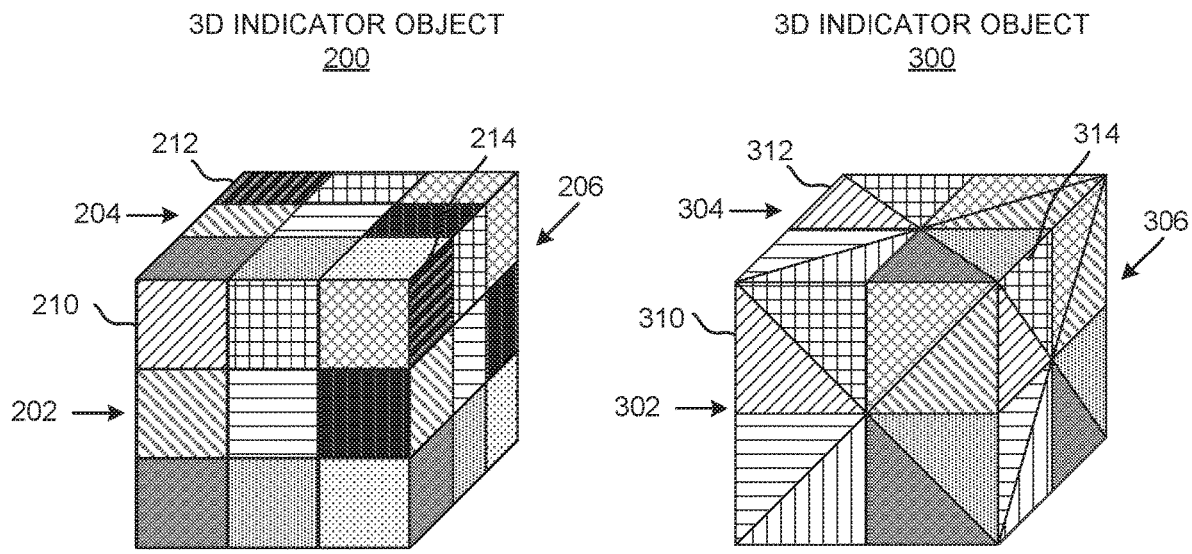
FIG. 2
FIG. 3

3D INDICATOR OBJECT

BACKGROUND

In three-dimensional (3D) printing, an additive printing process is often used to make three-dimensional solid parts from a digital model. 3D printing is often used in rapid product prototyping, mold generation, mold master generation, and short-run manufacturing. Some 3D printing techniques are considered additive processes because they involve the application of successive layers of material to an existing surface (template or previous layer). This is unlike traditional machining processes, which often rely upon the removal of material to create the final part. 3D printing often requires curing or fusing of the building material, which for some materials may be accomplished using heat-assisted extrusion, melting, or sintering, and for other materials may be accomplished using digital light projection technology.

BRIEF DESCRIPTION OF THE DRAWINGS

Features of the present disclosure are illustrated by way of example and not limited in the following figure(s), in which like numerals indicate like elements, in which:

FIG. 1 shows a block diagram of an example apparatus that may be employed to fabricate a 3D indicator object;

FIGS. 2 and 3, respectively, show perspective views of example 3D indicator objects;

DETAILED DESCRIPTION

Figure 4:
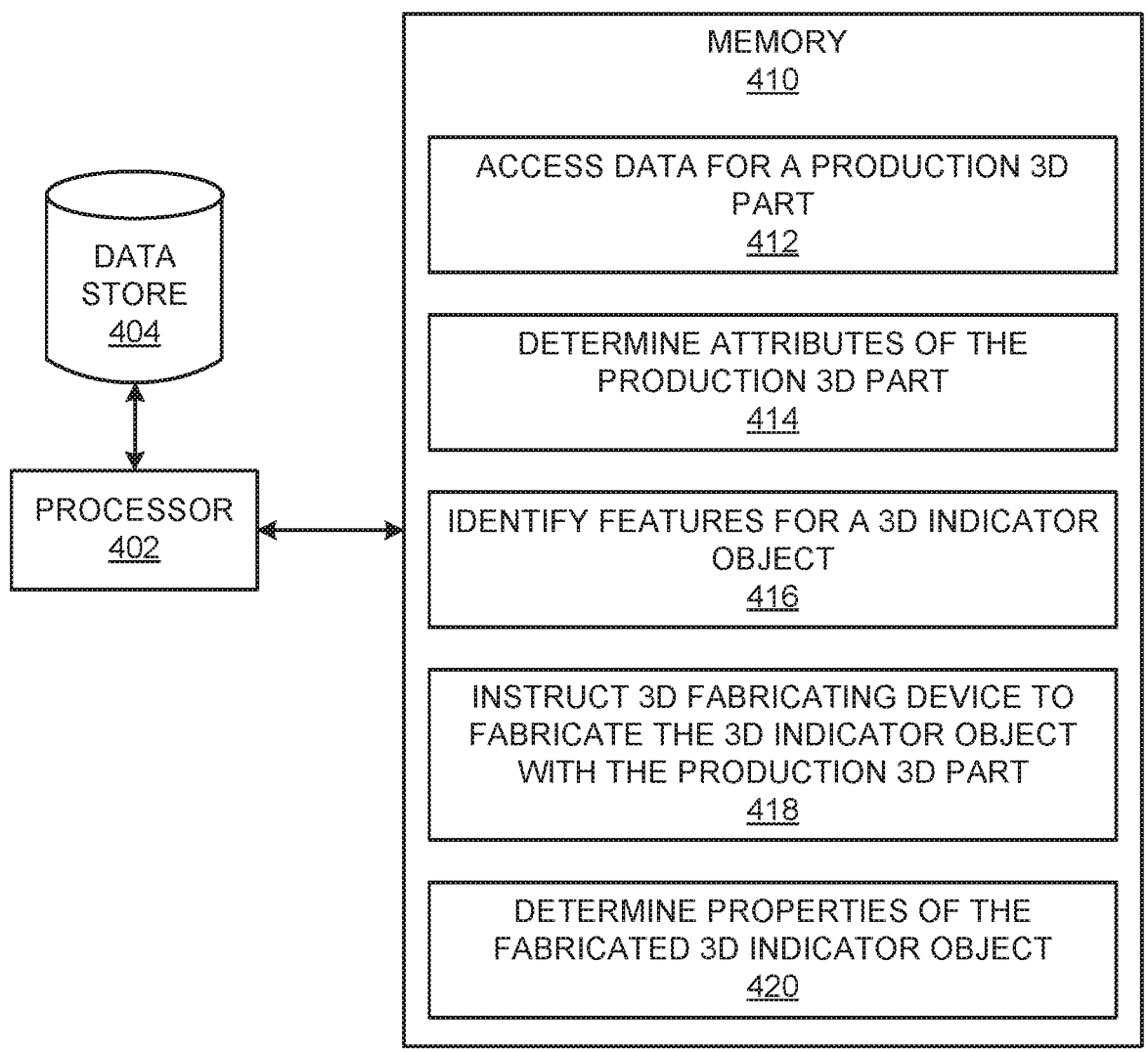
FIG. 4 shows a block diagram of another example apparatus that may be employed to fabricate a 3D indicator object.

Disclosed herein are apparatuses and methods for fabricating a 3D indicator object or multiple 3D indicator objects. The 3D indicator objects may be objects that may be used to identify properties of production 3D parts and/or operating conditions of a 3D fabricating device. For instance, the 3D indicator objects may have simpler geometries than corresponding production 3D parts and may be formed to have colors arranged in a predefined pattern. As such, properties of the 3D indicator objects may be simpler to determine than the properties of corresponding production 3D parts and those determined properties may be inferred for production 3D parts. Additionally, the 3D indicator objects may be damaged to determine various properties of the 3D indicator objects and the determined various properties may be inferred for the corresponding production 3D parts without having to damage those production 3D parts. The properties of the 3D indicator objects may also be used to determine the operating conditions of the 3D fabricating device, e.g., whether printheads are operating properly, whether fusing operations need to be adjusted, etc. In some examples, the 3D indicator objects may be fabricated without fabricating a corresponding production 3D part.

According to examples, a plurality of 3D indicator objects may be fabricated at different locations of a printing bed. For instance, the 3D indicator objects may be fabricated at locations where conditions, e.g., thermal conditions, printing conditions, etc., may vary across the printing bed. As such, the properties of the 3D indicator objects may vary with respect to each other and thus, the properties of production 3D parts or portions of 3D parts fabricated near the respective 3D indicator objects may be more accurately determined.

Before continuing, it is noted that as used herein, the terms "includes" and "including" mean, but is not limited to, "includes" or "including" and "includes at least" or "including at least." The term "based on" means "based on" and "based at least in part on."

With reference first to FIG. 1, there is shown a block diagram of an example apparatus 100. The apparatus 100 may include a processor 102 that may control operations of the apparatus 100. The processor 102 may be a semiconductor-based microprocessor, a central processing unit (CPU), an application specific integrated circuit (ASIC), and/or other hardware device. The apparatus 100 may also include a memory 110 that may have stored thereon machine readable instructions 112-116 (which may also be termed computer readable instructions) that the processor 102 may execute. The memory 110 may be any electronic, magnetic, optical, or other physical storage device that contains or stores executable instructions. Thus, the memory 110 may be, for example, Random Access Memory (RAM), an Electrically Erasable Programmable Read-Only Memory (EEPROM), a storage device, an optical disc, and the like. The memory 110, which may also be referred to as a computer readable storage medium, may be a non-transitory machine-readable storage medium, where the term "non-transitory" does not encompass transitory propagating signals.

The processor 102 may fetch, decode, and execute the instructions 112 to identify features for a 3D indicator object to be fabricated by a 3D fabricating device, in which the identified features define a shape and a pattern of colors for the 3D indicator object. The processor 102 may also fetch, decode, and execute the instructions 114 to instruct the 3D fabricating device to fabricate the 3D indicator object to have the identified features, in which the 3D indicator object may have a shape having a plurality of surfaces on which a plurality of colors are arranged in a certain pattern as defined by the identified features, and in which each of the plurality of surfaces may have the same certain pattern of the plurality of colors. The processor 102 may further fetch, decode, and execute the instructions 116 to determine properties of the fabricated 3D indicator object. Various manners in which each of the instructions 112-116 may be implemented are described in greater detail elsewhere herein.

As discussed in greater detail herein, the properties of the fabricated 3D indicator object may be used to determine properties of a production 3D part or parts that are printed with the 3D indicator object or that are to be printed by a 3D fabricating device. In addition or as another example, the properties of the fabricated 3D indicator object may be used to determine operating conditions of the 3D fabricating device itself, e.g., whether all of the printheads are functioning properly, whether proper amounts of energy are being applied to fabricate the 3D indicator object, or the like.

According to examples, the apparatus 100 may be a computing apparatus, e.g., a personal computer, a laptop computer, a tablet computer, a smartphone, or the like. In these examples, the apparatus 100 may be separate from the 3D fabricating device and may communicate instructions to the 3D fabricating device over a direct or a network connection. In other examples, the apparatus 100 may be a part of the 3D fabricating device. In these examples, the apparatus 100 may be part of a control system of the 3D fabricating device and may communicate instructions to fabrication components of the 3D fabricating device, for instance, over a bus, to cause the 3D indicator object to be fabricated. By way of example, the processor 102 may communicate instructions to or otherwise control the fabrication components, which may be components of the 3D fabricating device, to fabricate the 3D indicator object.

Turning now to FIG. 2, there is shown a perspective view of an example 3D indicator object 200 that may be fabricated by a 3D fabricating device. As shown, the 3D indicator object 200 may be formed to have a cubic shape and may thus have six side surfaces that have the same dimensions with respect to each other. Three of the side surfaces are labeled with reference numerals 202, 204, and 206. Additionally, each of the side surfaces 202, 204, and 206 is depicted as having a plurality of different colors arranged in respective blocks and in a certain pattern as represented by the respective shadings. Each of the blocks forming the patterns on each of the side surfaces 202, 204, and 206 may have a square shape and may have the same sizes with respect to each other. The respective shadings applied to the blocks may represent different colors and the same shadings may represent the same color.

As shown, a first block 210 on the first side surface (or equivalently, first face) of the 3D indicator object 200 may have a first color. Likewise, corresponding first blocks 212, 214 on the second and third side surfaces 204, 206 may have the same color as the first block 210 as denoted by the blocks 210, 212, 214 having the same shading. The color pattern of the remaining blocks on the first face 202, e.g., the arrangement of the multiple colors, may be repeated on the remaining faces of the 3D indicator object 200 such that the same pattern of colors may be visible regardless of which side surface a viewer is facing. In one regard, by creating the same pattern of colors on each of the faces 202, 204, and 206 of the 3D indicator object 200, a common testing template may be used to investigate properties of each side surface of the 3D indicator object 200. For instance, the common testing template may be used to determine properties of the 3D indicator object 200 as discussed in greater detail herein.

According to examples, some of the blocks may have colors that correspond to individual colors of printing fluids that a 3D fabricating device may deposit to form 3D parts. By way of example in which the 3D fabricating device is to deposit printing fluids having the colors cyan, magenta, yellow, and black, one of the blocks on each of the side surfaces may be cyan, another one of the blocks on each of the side surfaces may be magenta, and so forth. Additionally, each of the printing fluids that the 3D fabricating device may deposit to form 3D parts may be represented by one of the blocks on each of the side surfaces of the 3D indicator object 200. In one regard, therefore, each of the devices that deliver different color printing fluids may be employed in the fabrication of the 3D indicator object 200. As such, improperly operating printing fluid delivery devices may be identified based upon defects in the printed colors.

One or some of the blocks on each of the side surfaces may also include other colors. The other colors may be a combination of colors formed from mixing the printing fluids that may be deposited by the 3D fabricating device or from different colored ink. The other colors may include, for instance, a white color, different shades of colors, special colors, such as the colors used in a company's logo or other special color, or the like. Accordingly, the 3D indicator object 200 may be employed to determine whether the special colors may be printed properly.

According to examples, a hardware device, such as a calibrated camera, an imaging system, a charge-coupled device, or the like, may be employed to capture images of the 3D indicator object 200. For instance, the hardware device may be used to capture a respective image of each of the side surfaces of the 3D indicator object 200. In these examples, and with reference back to FIG. 1, the processor 102 may execute the instructions 116 to determine properties of the fabricated 3D indicator object 200 from the captured images. By way of example, the processor 102 may execute the instructions 116 to compare each of the side surfaces with a template and may determine the properties of the 3D indicator object 200 from the comparisons. In this example, the template may include data indicating the locations and the color values of each of the blocks. In addition, the processor 102 may determine deviations between the blocks in the captured images and the blocks in the template to determine properties of the fabricated 3D indicator object 200.

The properties of the fabricated 3D indicator object 200 that may be determined from captured images of the 3D indicator object 200 may include the geometry of the 3D indicator object 200, the colors of the blocks, the surface properties, combinations thereof, and the like. The geometry of the 3D indicator object 200 may include geometries of the blocks, e.g., whether any of the edges between the blocks are warped or otherwise include imperfections, whether any of the edges or predefined lines are longer or shorter than intended, or the like. The surface properties may include the reflectivity and the like, of the 3D indicator object 200 surfaces. The processor 102 may determine whether the colors of any of the blocks on the side surfaces of the 3D indicator object 200 differ from their originally intended colors, e.g., whether the colors are darker or lighter than originally intended. As another example, the processor 102 may determine whether any of the blocks on the side surfaces has any spaces or gaps in them.

Other properties of the 3D indicator object 200, such as those that may not be determined from a captured image of the 3D indicator object 200 may include, for instance, mechanical properties, microstructure properties, electrical properties, magnetic properties, combinations thereof, etc. The mechanical properties, such as elasticity, strength, or the like, may be determined through physical testing of the 3D indicator object 200, which may involve destroying the 3D indicator object 200. The microstructure properties, such as the porosity, density, whether cracks exist, whether build material particles are completely fused together, whether printing fluids have impurities, etc., may also be determined through physical testing. Additionally, the electrical properties and/or the magnetic properties of the 3D indicator object 200 may be determined through physical testing of the 3D indicator object 200.

According to examples, the determined properties of the 3D indicator object 200 may be used as an indicator of a plurality of properties of a production 3D part or parts that are fabricated by the 3D fabricating device. A production 3D part may be defined as a part that a user, such as a customer, operator, or the like, instructs the 3D fabricating device to fabricate and may have a relatively more complex and/or irregular shape than the 3D indicator object 200. In other words, a production 3D part may be any part that the 3D fabricating device is instructed to fabricate other than a 3D indicator object 200.

Thus, for instance, the properties of a production 3D part, e.g., color, shape, mechanical properties, surface textures, etc., may be inferred from the determined properties of the 3D indicator object 200. In addition, because the 3D indicator object 200 may have a simpler and standardized shape and color pattern, some of the properties, e.g., color, shape, etc., of the production 3D part may be determined in a relatively simpler manner than may be possible through an investigation of the production 3D part. Moreover, some of the properties, e.g., physical properties (such as mechanical, electrical, magnetic properties, etc.), material microstructure, etc., of the production 3D part may be inferred without destroying or otherwise damaging the production 3D part. Additionally, as discussed above, the investigation of the production 3D part may be made simpler through testing of the 3D indicator object 200, which may have a simpler and/or more regular shape than the production 3D part.

Additionally, or as another example, properties of the 3D fabricating device itself may be inferred from the determined properties of the 3D indicator object 200. For instance, if a block of the 3D indicator object 200 has a color that is darker than intended, a determination may be made that the 3D fabricating device applied too much heat during the fabrication process, e.g., the heating process may be malfunctioning or may require tuning. As another example, if a block of the 3D indicator object 200 has a gap, e.g., an empty streak, a determination may be made that a fluid delivery device that delivered printing fluid for that block malfunctioned. As a further example, if a block of the 3D indicator object 200 has a color that is lighter than intended, a determination may be made that the block was printed with a shortage of printing fluid, e.g., printing fluid of a particular color may need to be replenished.

According to examples, the determined properties of the 3D indicator object 200 may be stored to archive conditions under with production 3D parts have been fabricated. The archived conditions may be used for quality control, for resolving customer inquiries, etc. Additionally, the 3D indicator object 200 itself may be physically saved such that questions pertaining to production 3D parts that were fabricated concurrently with the 3D indicator object 200 and/or by the same 3D fabricating device may be resolved using the actual 3D indicator object 200.

Although the 3D indicator object 200 has been depicted as having a particular shape and a particular pattern of colors, it should be understood that the 3D indicator object 200 may be fabricated to have other shapes and/or color patterns. For instance, the 3D indicator object may have a spherical shape, a pyramidal shape, a conical shape, a plate shape, a dogbone shape, or the like. According to examples, the shape of the 3D indicator object 200 may be based upon types of production 3D parts that are to be fabricated, types of 3D fabricating devices used to fabricate the 3D indicator object 200, a selected printing mode, and the like. Additionally, colors may be provided on the sides of the 3D indicator object at different patterns. An example of a 3D indicator object 300 having a different color pattern than the color pattern provided on the 3D indicator object 200 is depicted in FIG. 3. FIG. 3 shows a perspective view of an example 3D indicator object 300 that may be fabricated by a 3D fabricating device.

As shown, the 3D indicator object 300 may be formed to have a cubic shape and may thus have six side surfaces that have the same dimensions with respect to each other. Three of the side surfaces are labeled with reference numerals 302, 304, and 306. Additionally, each of the side surfaces 302, 304, and 306 is depicted as having a plurality of different colors arranged in respective triangular blocks and in a certain pattern. Each of the triangular blocks forming the patterns on each of the side surfaces 302, 304, and 306 may have the same sizes with respect to each other. The respective shadings applied to the triangular blocks may represent different colors and the same shadings may represent the same color.

As shown, a first triangular block 310 on the first side surface 302 (or equivalently, first face) of the 3D indicator object 300 may have a first color. Likewise, corresponding first triangular blocks 312, 314 on the second and third side surfaces 304, 306 may have the same color as the first triangular block 310 as denoted by the blocks 310, 312, 314 having the same shading. The color pattern of the remaining blocks on the first face 302, e.g., the arrangement of the multiple colors, may be repeated on the remaining faces of the 3D indicator object 300 such that the same pattern of colors may be visible regardless of which side surface a viewer is facing. In one regard, by creating the same pattern of colors on each of the faces 302, 304, and 306 of the 3D indicator object 300, a common testing template may be used to investigate properties of each side surface of the 3D indicator object 300. For instance, the common testing template may be used to determine whether there are any defects in the 3D indicator object 300 as discussed in greater detail herein.

According to examples, some of the blocks may have colors that correspond to individual colors of printing fluids that a 3D fabricating device may deposit to form 3D parts. By way of example in which the 3D fabricating device is to deposit printing fluids having the colors cyan, magenta, yellow, and black, one of the blocks on each of the side surfaces may be cyan, another one of the blocks on each of the side surfaces may be magenta, and so forth. Additionally, each of the printing fluids that the 3D fabricating device may deposit to form 3D parts may be represented by one of the blocks on each of the side surfaces of the 3D indicator object 300. In one regard, therefore, each of the devices that deliver different color printing fluids may be employed in the fabrication of the 3D indicator object 300. As such, improperly operating printing fluid delivery devices may be identified based upon defects in the printed colors.

One or some of the blocks on each of the side surfaces may also include other colors. The other colors may be a combination of colors formed from mixing the printing fluids that may be deposited by the 3D fabricating device. The other colors may include, for instance, a white color, different shades of colors, special colors, such as the colors used in a company's logo or other special color, or the like. The other colors may be mixed prior to being applied or may be mixed during application of the printing fluids. Accordingly, the 3D indicator object 200 may be employed to determine whether the special colors may be printed properly on production 3D parts.

The properties of the 3D indicator object 300 may be determined in any of the manners discussed above with respect to the 3D indicator object 200. Additionally, properties of the 3D fabricating device may be determined from the 3D indicator object 300 in any of the manners discussed above.

Turning now to FIG. 4, there is shown a block diagram of another example apparatus 400. As shown, the apparatus 400 may include a processor 402, a data store 404, and a memory 410. The processor 402 may control operations of the apparatus 400 and may be a computing device, a semiconductor-based microprocessor, a central processing unit (CPU), an application specific integrated circuit (ASIC), and/or other hardware device. The memory 410 may have stored thereon machine readable instructions 412-420 (which may also be termed computer readable instructions) that the processor 402 may execute. The memory 410 may be any electronic, magnetic, optical, or other physical storage device that contains or stores executable instructions. Thus, the memory 110 may be, for example, Random Access Memory (RAM), an Electrically Erasable Programmable Read-Only Memory (EEPROM), a storage device, an optical disc, and the like. The memory 410, which may also be referred to as a computer readable storage medium, may be a non-transitory machine-readable storage medium, where the term "non-transitory" does not encompass transitory propagating signals.

The processor 402 may fetch, decode, and execute the instructions 412 to access data for a production 3D part to be fabricated by a 3D fabricating device. For instance, the processor 404 may access the data for the production 3D part from the data store 404. The processor 402 may fetch, decode, and execute the instructions 414 to determine attributes of the production 3D part from the accessed data. The attributes may include, for instance, colors to be used in the fabrication of the production 3D part, a shape of the production 3D part, and the like. The processor 402 may fetch, decode, and execute the instructions 416 to identify features for a 3D indicator object 200, 300 to be fabricated by the 3D fabricating device, in which the identified features define a shape of the 3D indicator object 200, 300 and a pattern of colors for the 3D indicator object 200, 300. Particularly, the processor 402 may identify the features for the 3D indicator object 200, 300 from the determined attributes of the production 3D part. For instance, the processor 402 may identify the features for the 3-D indicator object 200, 300 to be equivalent to the determined features of the production 3D part.

The processor 402 may also fetch, decode, and execute the instructions 418 to instruct the 3D fabricating device to fabricate the 3D indicator object 200, 300 to have the identified features. The processor 402 may also instruct the 3D fabricating device to fabricate the production 3D part concurrently with the fabrication of the 3D indicator object 200, 300. That is, the processor 402 may instruct the 3-D fabricating device to fabricate both the 3D indicator object 200, 300 and the production 3D part on a print bed during a common printing operation run. As discussed above, the 3D indicator object may have a shape having a plurality of surfaces on which a plurality of colors are arranged in a certain pattern as defined by the identified features, and in which each of the plurality of surfaces may have the same certain pattern of the plurality of colors. The processor 402 may further fetch, decode, and execute the instructions 420 to determine properties of the fabricated 3D indicator object. Various manners in which each of the instructions 412-420 may be implemented are described in greater detail elsewhere herein.

Figure 5:
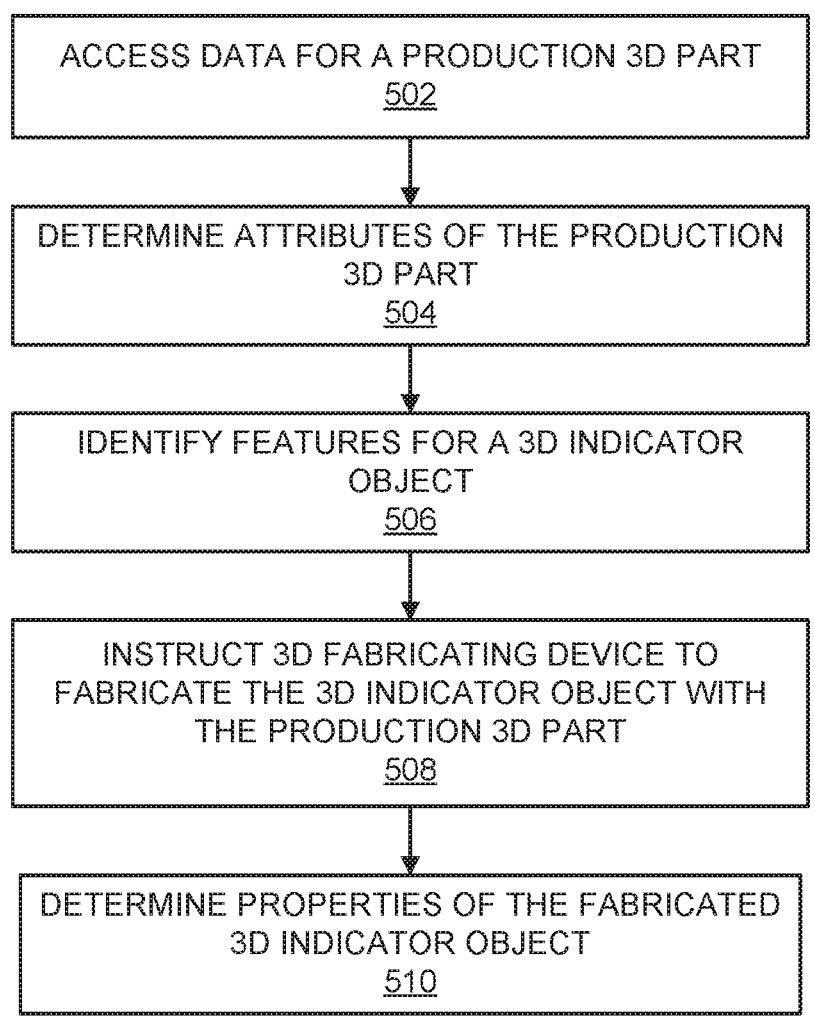
FIG. 5 depicts an example method for fabricating a 3D indicator object.

Various manners in which the apparatus 400 may be implemented are discussed in greater detail with respect to the method 500 depicted in FIG. 5. Particularly, FIG. 5 depicts an example method 500 for fabricating a 3D indicator object. It should be apparent to those of ordinary skill in the art that the method 500 may represent a generalized illustration and that other operations may be added or existing operations may be removed, modified, or rearranged without departing from a scope of the method 500.

The description of the method 500 is made with reference to the apparatus 400 illustrated in FIG. 4 for purposes of illustration. It should be understood that apparatuses, e.g., computers, 3D printers, or the like, having other configurations may be implemented to perform the method 500 without departing from a scope of the method 500.

At block 502, the processor 402 may execute the instructions 412 to access data pertaining to a 3D part that is to be printed. By way of example, the processor 402 may access data stored in the data store 404 pertaining to a production 3D part that is to be fabricated by a 3D fabrication device. The processor 402 may determine the number of layers of build material particles that are to be formed, the locations at which a printing fluids, e.g., colored inks, dyes, and the like are to be deposited onto the respective layers, fusing energy that is to be applied to each of the layers, etc., in order to fabricate the production 3D part.

At block 504, the processor 402 may execute the instructions 414 to determine attributes of the production 3D part from the data accessed at block 502. For instance, the processor 402 may determine the colors that are to be used to fabricate the production 3D part, the shape of the production 3D part, etc.

At block 506, the processor 402 may execute the instructions 416 to identify features for a 3D indicator object 200, 300 to be fabricated by the 3D fabricating device. The features may include colors that are to be printed on the 3D indicator object 200, 300, a shape of the 3D indicator object 200, 300, and the like. For instance, the processor 402 may determine that the blocks of the 3D indicator object 200, 300 are to include a respective color corresponding to a color to be used in the production 3D part. The processor 402 may also determine that some of the blocks of the 3D indicator object 200, 300 are to include a color corresponding to the colors of respective printing fluids used by the 3D fabricating device as discussed above with respect to FIG. 2.

The processor 402 may further determine the shape of the 3D indicator object 200, 300 based upon the shape of the production 3D part. For instance, the processor 402 may determine the shape of the 3-D indicator object 200, 300 to be a simplified version of the shape of the production 3D part. In this example, the processor 402 may determine that the 3D indicator object 200, 300 is to have a cubic shape in response to a determination that the production 3D part has a generally symmetrical configuration. As another example, the processor 402 may determine that the 3D indicator object 200, 300 is to have a pyramidal or conical shape in response to a determination that the production 3D part has an asymmetrical shape. As a further example, the processor 402 may determine that the 3D indicator object 200, 300 is to have a dog-bone shape in response to a determination that properties, such as mechanical properties, of the production 3D part are to be determined through testing of the 3D indicator object 200, 300. In other examples, the processor 402 may determine that the 3D indicator object 200, 300 is to have the same shape regardless of the shape of the production 3D part.

At block 508, the processor 402 may execute the instructions 418 to instruct the 3D fabricating device to fabricate the 3D indicator object 200, 300 to have the features identified at block 506. The processor 402 may also execute the instructions 418 to instruct the 3D fabricating device to fabricate the production 3D part. Thus, the processor 402 may instruct the 3D fabricating device to fabricate the 3D indicator object 200, 300 concurrently with the production 3D part, e.g., during a common fabrication run. In examples in which the apparatus 400 is separate from the 3D fabricating device, the processor 402 may communicate instructions over a wired or wireless connection to the 3D fabricating device. In examples in which the apparatus 400 as part of the 3D fabricating device or is the 3D fabricating device, the processor 402 may communicate instructions to fabricating components of the 3D fabricating device over an internal connection, e.g., a bus.

At block 510, the processor 402 may execute the instructions 420 to determine properties of the fabricated 3D indicator object 200, 300. As discussed in greater detail herein, the properties of the fabricated 3D indicator object 200, 300 may include a geometry, colors, surface properties, or the like of the fabricated 3D indicator 200, 300. The processor 402 may also determine other properties including, for instance, microstructure properties, electrical properties, magnetic properties, combinations thereof, etc. As also discussed in greater detail herein, the determined properties of the fabricated 3D indicator object 200, 300 may be used to infer properties of the production 3D part and/or the operating condition of the 3D fabricating device. According to examples, the properties of the fabricated 3D indicator object 200, 300 may be determined following performance of finishing operations on the fabricated 3D indicator object 200, 300. The finishing operations may include operations that are performed to finish production 3D parts, e.g., polishing, drying, etc.

Although the method 500 has been described with respect to a single production 3D part and a single 3D indicator object 200, 300, it should be understood that the method 500 may be applied to fabricate multiple production 3D parts and/or multiple 3D indicator objects 200, 300. For instance, the processor 402 may access data for a plurality of production 3D parts at block 502 and may determine attributes of the plurality of production 3D parts at block 504. In addition, the processor 402 may identify features for a plurality of 3D indicator objects, in which the identified features may be the same for each of the 3D indicator objects or may differ for the 3D indicator objects. For instance, the processor 402 may determine that a first 3D indicator object is to have features that correspond to a first production 3D part, that a second 3D indicator object is to have features that correspond to a second production 3D part, and so forth. Thus, for instance, 3D indicator objects may be identified to have features that correspond to different production 3D parts.

The processor 402 may instruct the 3D fabricating device to fabricate the plurality of 3D indicator objects and the plurality of production 3D parts. For instance, the processor 402 may instruct the 3D fabricating device to fabricate the plurality of 3D indicator parts and the plurality of production 3D parts during a common fabrication run, e.g., from the same layers of build material particles. According to examples, the processor 402 may instruct the 3D fabricating device to fabricate the plurality of 3D indicator objects at different locations of a print bed. For instance, the processor 402 may instruct the 3D fabricating device to fabricate a first 3D indicator object near a central location of the print bed, a second 3D indicator object at a second location of the print bed, a third 3D indicator object at a third location of the print bed, etc. By fabricating the 3D indicator objects at different locations of the print bed, fabrication conditions at the different locations may be determined from the properties of the 3D indicator objects fabricated at those locations. As an example, different locations of the print bed may experience different thermal conditions and thus, the production 3D parts fabricated at the different locations may have different properties with respect to each other.

Some or all of the operations set forth in the method 500 may be contained as utilities, programs, or subprograms, in any desired computer accessible medium. In addition, the method 500 may be embodied by computer programs, which may exist in a variety of forms both active and inactive. For example, they may exist as machine readable instructions, including source code, object code, executable code or other formats. Any of the above may be embodied on a non-transitory computer readable storage medium. Examples of non-transitory computer readable storage media include computer system RAM, ROM, EPROM, EEPROM, and magnetic or optical disks or tapes. It is therefore to be understood that any electronic device capable of executing the above-described functions may perform those functions enumerated above.

Figure 6:
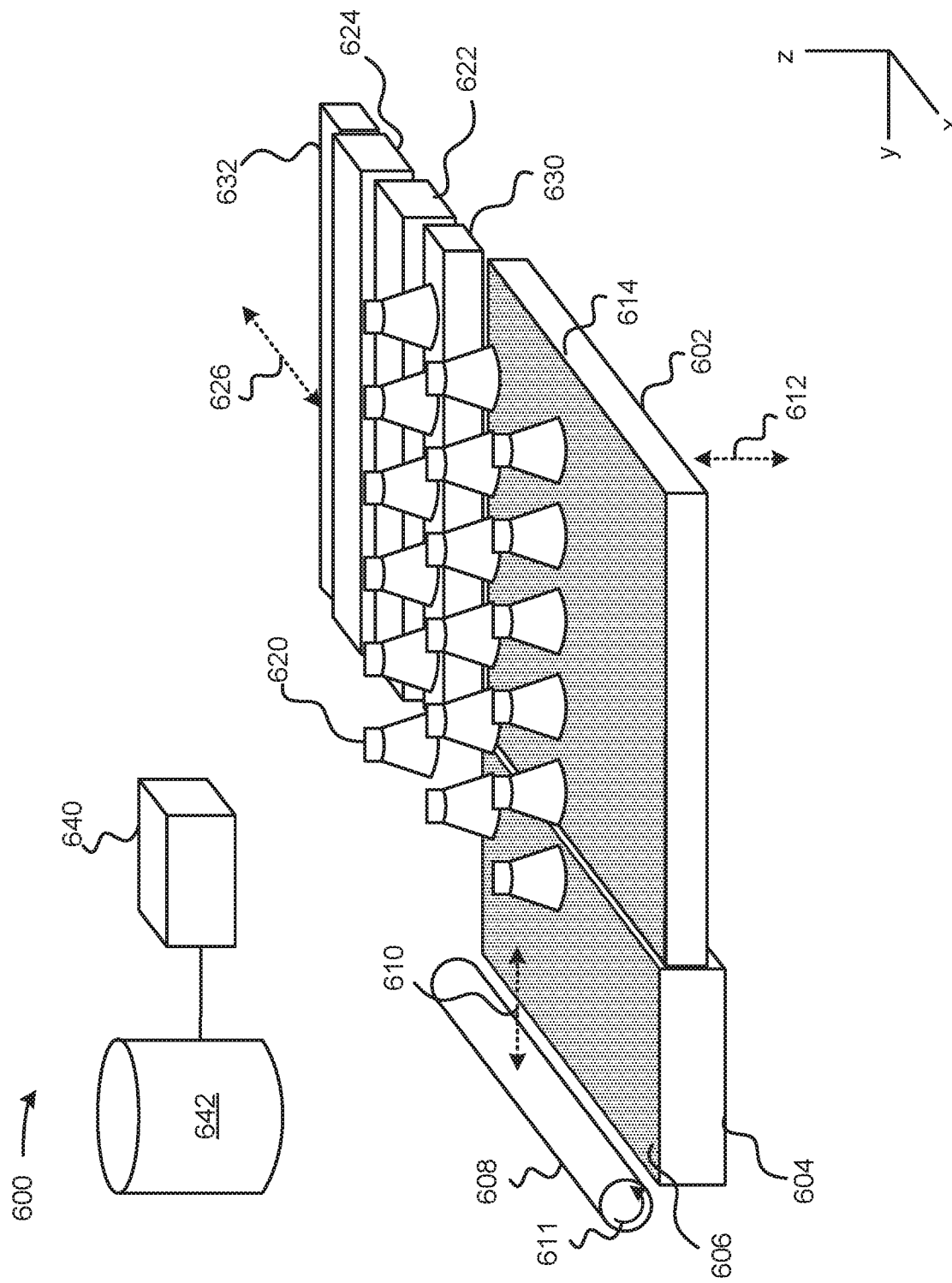
FIG. 6 shows a simplified block diagram of an example 3D fabricating device that may fabricate a 3D indicator object.

The 3D fabricating device implemented to fabricate the 3D indicator objects 200, 300 and the production 3D parts disclosed herein may be any suitable type of 3D fabricating device, for instance, any type of suitable additive 3D fabricating device. Examples of suitable 3D fabricating devices may include fabricating devices that employ multi-jet fusion technology, selective laser sintering technology, selective laser melting technology, and the like. A simplified block diagram of an example 3D fabricating device 600 that employs multi-jet fusion technology and may be employed to fabricate a 3D indicator object is depicted in FIG. 6.

The 3D fabricating device 600 may include a build area platform 602, a build material particle bin 604 containing build material particles 606, and a recoater 608. The recoater 608 may be translated in a direction as denoted by the arrow 610, e.g., along the y-axis, over the build material particle bin 604 and across the build area platform 602 to spread the build material particles 606 into a layer 614 over a surface of the build area platform 602. As the recoater 608 is translated in the direction denoted by the arrow 610, the recoater 608 may be rotated, e.g., in a counter-clockwise direction as denoted by the arrow 611. The recoater 608 may be employed to form the layer 614 to have a substantially uniform thickness across the build area platform 602. In an example, the thickness of the layer 614 may range from about 90 µm to about 110 µm, although thinner or thicker layers may also be used. For example, the thickness of the layer 614 may range from about 20 µm to about 200 µm, or from about 50 µm to about 200 µm.

The 3D fabricating device 600 may also include a plurality of warming devices 620 arranged in an array above the build area platform 602. Each of the warming devices 620 may be a lamp or other heat source that is to apply heat onto spread layers of the build material particles 606, for instance, to maintain the build material particles 606 within a predetermined temperature range.

The 3D fabricating device 600 may further include a first delivery device 622 and a second delivery device 624, which may both be scanned across the layer 614 in both of the directions indicated by the arrow 626, e.g., along the x-axis. For instance, the first delivery device 622 may deposit first liquid droplets as the first delivery device 622 is scanned in an x direction 626 and the second delivery device 624 may deposit second liquid droplets as the second delivery device 624 is scanned in an opposite x direction 626. The first delivery device 622 and the second delivery device 624 may be thermal inkjet printheads, piezoelectric printheads, or the like, and may extend a width of the build area platform 602. The first delivery device 622 and the second delivery device 624 may each include a printhead or multiple printheads available from the Hewlett Packard Company of Palo Alto, Calif. The printheads may include nozzles and may apply different colored printing fluids onto the layer 614.

In other examples in which the first delivery device 622 and the second delivery device 624 do not extend the width of the build area platform 602, the first delivery device 622 and the second delivery device 624 may also be scanned along the y-axis to thus enable the first delivery device 622 and the second delivery device 624 to be positioned over a majority of the area above the build area platform 602. The first delivery device 622 and the second delivery device 624 may thus be attached to a moving XY stage or a translational carriage (neither of which is shown) that is to move the first delivery device 622 and the second delivery device 624 adjacent to the build area platform 602 in order to deposit respective liquids in predetermined areas of the layer 614 of the build material particles 606.

First liquid droplets may be delivered onto preselected areas of the layer 614, for instance, the areas containing build material particles 606 that are to be fused together to form a part of a 3D object. Second liquid droplets may be delivered onto preselected areas of the layer 614, for instance, the areas containing build material particles 606 that are to be fused together to form a part of a 3D object.

Following deposition of the first liquid droplets and/or the second liquid droplets onto selected areas of the layer 614 of the build material particles 606, a first radiation generator 630 and/or a second radiation generator 632 may be implemented to apply fusing radiation onto the build material particles 606 in the layer 614. Particularly, the radiation generator(s) 630, 632 may be activated and moved across the layer 614, for instance, along the directions indicated by the arrow 626 to apply fusing radiation in the form of light and/or heat onto the build material particles 606. Examples of the radiation generators 630, 632 may include UV, IR or near-IR curing lamps, IR or near-IR light emitting diodes (LED), halogen lamps emitting in the visible and near-IR range, or lasers with desirable electromagnetic wavelengths.

Following application of liquid droplets during the multiple passes and following application of the radiation to fuse selected sections of the build material particles 606 together, the build area platform 602 may be lowered as denoted by the arrow 612, e.g., along the z-axis. In addition, the recoater 608 may be moved across the build area platform 602 to form a new layer of build material particles 606 on top of the previously formed layer 614. Moreover, the first delivery device 622 may deposit first liquid droplets and the second delivery device 624 may deposit second liquid droplets onto respective selected areas of the new layer of build material particles 606 in single and/or multiple passes as discussed above. The above-described process may be repeated until a 3D indicator object or a plurality of 3D indicator objects have been fabricated. Additionally, the process may be repeated until a production 3D part or a plurality of production 3D parts have been fabricated.

As further shown in FIG. 6, the 3D fabricating device 600 may include a processor 640 that may control operations of the build area platform 602, the build material particle bin 604, the recoater 608, the warming devices 620, the first delivery device 622, the second delivery device 624, and the radiation generators 630, 632. Particularly, for instance, the processor 640 may control actuators (not shown) to control various operations of the 3D fabricating device 600 components. The processor 600 may be either of the processors 102 and 402 discussed above. Although not shown, the processor 600 may be connected to the 3D fabricating device 600 components via communication lines.

The processor 640 may also be in communication with a data store 642. The data store 642 may be equivalent to the data store 404 and may thus include data pertaining to a production 3D part and a 3D indicator object to be printed by the 3D fabricating device 600.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An apparatus comprising:
    a processor;
    a memory on which is stored instructions that are to cause the processor to:
        identify features for a three-dimensional (3D) indicator object to be fabricated by a 3D fabricating device based on print data of a production 3D part, wherein the 3D indicator object is a portion of the production 3D part, and wherein the identified features for the 3D indicator object include a shape having a predetermined number of surfaces and a same certain pattern of colors to appear on each of the surfaces of the 3D indicator object;
        instruct the 3D fabricating device to fabricate the 3D indicator object to have the shape having the predetermined number of surfaces and the same certain pattern of colors appearing on each of the surfaces as defined by the identified features;
        determine properties of the fabricated 3D indicator object including a characteristic of the surfaces of the fabricated 3D indicator object; and
        determine properties of the production 3D part based on the properties of the fabricated 3D indicator object, wherein the properties of the production 3D part are to be used by the 3D fabricating device to fabricate the production 3D part.

2. The apparatus according to claim 1, wherein the colors in the certain pattern of colors have a same size and shape with respect to each other.

3. The apparatus according to claim 1, wherein the properties of the fabricated 3D indicator object further include any of geometry, mechanical properties, microstructure properties, electrical properties, o magnetic properties of the fabricated 3D indicator object.

4. The apparatus according to claim 1, wherein the instructions are further to cause the processor to:
    access the print data for the production 3D part for the 3D fabricating device to fabricate;
    determine attributes of the production 3D part from the accessed print data; and
    identify the features for the 3D indicator object from the determined attributes of the production 3D part, wherein the identified features for the 3D indicator object are equivalent to the determined attributes of the production 3D part.

5. The apparatus according to claim 4, wherein the shape of the 3D indicator object is different from a shape of the production 3D part.

6. The apparatus according to claim 1, wherein the apparatus is the 3D fabricating device.

7. The apparatus according to claim 1, wherein the instructions are further to cause the processor to determine an operating condition of the 3D fabricating device based on the determined properties of the fabricated 3D indicator object.

8. Method comprising:
accessing first print data for a first production three-dimensional (3D) part for a 3D fabricating device to fabricate;
identifying features for a first 3D indicator object based upon attributes of the first production 3D part specified in the accessed first print data, wherein the first 3D indicator object is a portion of the first production 3D part, and wherein the identified features for the first 3D indicator object include a shape having a predetermined number of surfaces and a same certain pattern of colors to appear on each of the surfaces of the first 3D indicator object;
fabricating, at a first location of a printing area, the first 3D indicator object to have the shape having the predetermined number of surfaces and the same certain pattern of colors appearing on each of the surfaces of the first 3D indicator object according to the identified features; and
determining properties of the first fabricated 3D indicator object including a characteristic of the surfaces of the first fabricated 3D indicator object, wherein the determined properties of the first fabricated 3D indicator object are used by the 3D fabricating device to fabricate the first production 3D part.

9. The method according to claim 8, wherein the attributes of the first production 3D part comprise a plurality of colors to be used to fabricate the first production 3D part and wherein the certain pattern of colors to appear on each of the surfaces of the first 3D indicator object is identified based on the plurality of colors to be used to fabricate the first production 3D part.

10. The method according to claim 8, further comprising:
determining properties of the first production 3D part based on the determined properties of the first fabricated 3D indicator object.

11. The method according to claim 10, further comprising:
determining an operating condition of the 3D fabricating device based on the determined properties of the first fabricated 3D indicator object.

12. The method according to claim 8, further comprising:
accessing second print data for a second production 3D part for the 3D fabricating device to fabricate;
identifying second features for a second 3D indicator object based upon attributes of the second production 3D part specified in the accessed second print data; and
fabricating, at a second location of the printing area, the second 3D indicator object corresponding to the identified second features while fabricating the second production 3D part.

13. The method according to claim 12, wherein the second location is determined to have a different thermal condition as compared to the first location.

14. A three-dimensional (3D) fabricating device comprising:
fabrication components;
a processor; and
a memory storing instructions that when executed cause the processor to:
access first print data for a first production three-dimensional (3D) part for the fabrication components to fabricate;
identify features for a first 3D indicator object based upon attributes of the first production 3D part specified in the accessed first print data, wherein the first 3D indicator object is a portion of the first production 3D part, and wherein the identified features for the first 3D indicator object include a shape having a predetermined number of surfaces and a same certain pattern of colors to appear on each of the surfaces of the first 3D indicator object;
control the fabrication components to fabricate, on a first location of a printing area, the first 3D indicator object to have the shape having the predetermined number of surfaces and the same certain pattern of colors appearing on each of the surfaces of the first 3D indicator object according to the identified features; and
determine properties of the first fabricated 3D indicator object including a characteristic of the surfaces of the first fabricated 3D indicator object, wherein the fabrication components are to use the determined properties of the first fabricated 3D indicator object to determine properties of the first production 3D part to fabricate the first production 3D part.

15. The 3D fabricating device according to claim 14, wherein the processor is further to:
access second print data for a second production 3D part for the 3D fabricating device to fabricate;
identify second features for a second 3D indicator object based upon attributes of the second production 3D part specified in the accessed second print data; and
control the fabrication components to fabricate, at a second location of the printing area, the second 3D indicator object corresponding to the identified second features for the second 3D indicator object.

\* \* \* \* \*